(12) United States Patent
Nagashima et al.

(10) Patent No.: US 6,647,321 B2
(45) Date of Patent: Nov. 11, 2003

(54) METHOD OF CONTROLLING COOLING SYSTEM FOR A PERSONAL COMPUTER AND PERSONAL COMPUTER

(75) Inventors: Kenichi Nagashima, Ebina (JP); Tsuyoshi Nakagawa, Hadano (JP); Kenichi Saito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 134 days.

(21) Appl. No.: 09/796,450

(22) Filed: Mar. 2, 2001

(65) Prior Publication Data

US 2002/0091468 A1 Jul. 11, 2002

(30) Foreign Application Priority Data

Dec. 19, 2000 (JP) .................................. 2000-385051

(51) Int. Cl.[7] .......................... G05D 23/00; H05K 7/20; G01K 1/08
(52) U.S. Cl. ....................... 700/300; 700/282; 361/689; 702/132
(58) Field of Search .................. 700/282, 299, 700/300; 361/688, 690, 689; 702/132

(56) References Cited

U.S. PATENT DOCUMENTS

| | | | | |
|---|---|---|---|---|
| 4,257,552 A | * | 3/1981 | Farkas et al. | 236/1 R |
| 5,058,389 A | * | 10/1991 | Yasuda et al. | 62/99 |
| 5,731,954 A | * | 3/1998 | Cheon | 361/699 |
| 6,336,080 B1 | * | 1/2002 | Atkinson | 702/132 |
| 6,349,385 B1 | * | 2/2002 | Kaminski et al. | 713/300 |
| 6,404,640 B1 | * | 6/2002 | Ishimine et al. | 361/720 |
| 6,408,630 B2 | * | 6/2002 | Macias et al. | 62/3.7 |
| 6,425,092 B1 | * | 7/2002 | Evans et al. | 714/13 |
| 6,470,289 B1 | * | 10/2002 | Peters et al. | 702/132 |
| 6,519,955 B2 | * | 2/2003 | Marsala | 62/119 |

FOREIGN PATENT DOCUMENTS

| | | |
|---|---|---|
| JP | 6-266474 | 9/1994 |
| JP | 7-142886 | 6/1995 |

\* cited by examiner

*Primary Examiner*—Leo Picard
*Assistant Examiner*—Elliot Frank
(74) *Attorney, Agent, or Firm*—Mattingly, Stanger & Malur, P.C.

(57) ABSTRACT

In an information processing apparatus, a heat-generating portion including at least a CPU is cooled by circulation of a cooling liquid, the temperature of the cooling liquid is measured and the operating condition of a pump for circulating the cooling liquid is obtained in accordance with the measured temperature of the cooling liquid. The pump is operated on the basis of the operating condition to control the flow rate of the circulated cooling liquid. Further, even after the system for the information processing apparatus stops, the circulation of the cooling liquid is continued until the temperature of the heat-generating portion becomes not higher than a predetermined value.

1 Claim, 12 Drawing Sheets

FIG. 4

PARAMETER TABLE (FREQUENCY)

11a

| TEMPERATURE IN-FORMATION (T1)°C | TEMPERATURE IN-FORMATION (T2)°C | FREQUENCY SETTING VALUE | ALRT1 SIGNAL | ALRT2 SIGNAL | ALRT3 SIGNAL | CONTROL |
|---|---|---|---|---|---|---|
| 0°C OR LOWER | 0°C OR LOWER | STOP | OFF | OFF | ON | DEFROSTING |
| LOWER THAN 5°C | LOWER THAN 5°C | 40Hz | ON | OFF | OFF | FREEZE PREVENTION |
| LOWER THAN 40°C | 5°C OR HIGHER | STOP | OFF | OFF | OFF | PUMP STOP |
| 40°C | * | 30Hz | ON | OFF | OFF | |
| 50°C | * | 35Hz | ON | OFF | OFF | |
| 60°C | * | 40Hz | ON | OFF | OFF | |
| 70°C | * | 45Hz | ON | OFF | OFF | PUMP OPERATION |
| 80°C | * | 50Hz | ON | OFF | OFF | |
| 90°C | * | 55Hz | ON | OFF | OFF | |
| 100°C | * | 60Hz | ON | OFF | OFF | |
| 110°C | * | 60Hz | ON | OFF | ON | SHIFTING TO CPU THROTTLING (ABNORMAL STATE) |
| 120°C | * | STOP | OFF | ON | ON | SYSTEM SHUT DOWN (ABNORMAL STATE) |

*: INDEFINITE

FIG. 6

PARAMETER TABLE (VOLTAGE)

| TEMPERATURE IN-FORMATION (T1)°C | TEMPERATURE IN-FORMATION (T2)°C | VOLTAGE SETTING VALUE | ALRT1 SIGNAL | ALRT2 SIGNAL | ALRT3 SIGNAL | CONTROL |
|---|---|---|---|---|---|---|
| 0°C OR LOWER | 0°C OR LOWER | STOP | OFF | OFF | ON | DEFROSTING |
| LOWER THAN 5°C | LOWER THAN 5°C | 50V | ON | OFF | OFF | FREEZE PREVENTION |
| LOWER THAN 40°C | 5°C OR HIGHER | STOP | OFF | OFF | OFF | PUMP STOP |
| 40°C | * | 60V | ON | OFF | OFF | PUMP OPERATION |
| 50°C | * | 65V | ON | OFF | OFF | |
| 60°C | * | 70V | ON | OFF | OFF | |
| 70°C | * | 80V | ON | OFF | OFF | |
| 80°C | * | 90V | ON | OFF | OFF | |
| 90°C | * | 100V | ON | OFF | OFF | |
| 100°C | * | 110V | ON | OFF | OFF | |
| 110°C | * | 110V | ON | ON | ON | SHIFTING TO CPU THROTTLING (ABNORMAL STATE) |
| 120°C | * | STOP | OFF | ON | ON | SYSTEM SHUT DOWN (ABNORMAL STATE) |

*: INDEFINITE

Ac 100V, 30Hz

Ac 100V, 60Hz

Ac 100V, 60Hz + INTERMITTENT

METHOD OF CONTROLLING COOLING SYSTEM FOR A PERSONAL COMPUTER AND PERSONAL COMPUTER

CROSS-REFERENCE TO RELATED APPLICATIONS

The present invention is related to (1) U.S. patent application Ser. No. 09/796,648 filed Mar. 5, 2001 entitled "METHOD OF CONTROLLING COOLING SYSTEM FOR A PERSONAL COMPUTER AND PERSONAL COMPUTER" claiming the Convention Priority based on Japanese Patent Application No. 2000-385050 and (2) U.S. patent application Ser. No. 09/796,561 filed Mar. 5, 2001 entitled "METHOD OF CONTROLLING COOLING SYSTEM FOR A PERSONAL COMPUTER AND PERSONAL COMPUTER" claiming the Convention Priority based on Japanese Patent Application No. 2000-385050.

BACKGROUND OF THE INVENTION

The present invention relates to a cooling technique and an information processing apparatus and particularly to a technique effectively adapted to a technique for cooling a space-saving type personal computer, or the like.

For example, with the advance of semiconductor techniques or the like, performance of a microprocessor used in a personal computer or the like has been improved remarkably. Particularly, a product with an operating frequency of the level of GHz has been used widely.

On the other hand, with the users' requirement for space saving and with reduction in cost of a liquid-crystal display, a so-called notebook type portable personal computer which has a liquid-crystal display and a body foldably connected to each other by a hinge has come into wide use. Moreover, an integral display type desktop personal computer which has a personal computer body integrated with the back or lower portion of a liquid-crystal display has come into wide use.

When a high-performance microprocessor with the level of GHz is mounted in such a space-saving type personal computer to provide the personal computer as a product, one of technical problems is means how to cool the microprocessor (to radiate heat from the microprocessor).

It is heretofore known that a cooling fan is disposed near the microprocessor or in a part of a housing so that the cooling fan forcedly generates an air stream passing through the microprocessor portion to radiate heat.

In the air-cooling system using such a fan, however, heat radiation has become insufficient because a large amount of heat is sent out when the existing high-speed microprocessor with the level of GHz is in operation. If heat radiation is to be made forcedly, a large-sized fan is required. There arises another technical problem in increase of the fan size and the housing size, increase of power consumption, increase of noise, or the like.

In such a space-saving type personal computer, small size, low noise, low power consumption, etc. are important selling points. Hence, increase in size of the housing, increase in power consumption and increase in noise as described above is a large technical problem against producing a space-saving type personal computer.

SUMMARY OF THE INVENTION

Therefore, it has been conceived that a liquid-cooling type cooling system using liquid as a thermal medium to thereby make it possible to achieve a large cooling capacity is employed. In this case, it is necessary to use a pump to circulate the liquid thermal medium between a heat-generating portion such as a microprocessor and a heat-radiating portion such as a radiator. In such a pump, however, the flow rate is generally controlled by the frequency or magnitude applied to the pump. Hence, there was a technical problem that a complex circuit such as a frequency control circuit or a voltage control circuit was required for controlling the flow rate of the thermal medium delicately.

On the other hand, the heat-radiating portion of the microprocessor, or the like, has a predetermined heat capacity. Hence, if cooling owing to the thermal medium is stopped immediately after the system is stopped, the temperature of the heat-radiating portion for the microprocessor, or the like, rises up rapidly because of residual heat. Hence, there was fear that the heat-radiating portion of the microprocessor, or the like, might be damaged by heat stress, etc.

An object of the present invention is to provide a technique in which reduction in size, noise and power consumption can be achieved in an information processing apparatus such as a space-saving type personal computer and, at the same time, high performance can be achieved by use of a microprocessor with a high operating frequency.

Another object of the present invention is to provide an information processing apparatus such as a space-saving type personal computer having a liquid-cooling type cooling system in which simplification of the configuration and control of a system for circulating a thermal medium is achieved.

A further object of the present invention is to provide an information processing apparatus such as a space-saving type personal computer having a liquid-cooling type cooling system in which failure is prevented from being caused by residual heat after the apparatus stops.

According to an aspect of the present invention, in an information processing apparatus having an information processing portion and an information display portion which are integrated with each other, there is provided a cooling method for cooling a heat-generating portion of the information processing apparatus by circulating a thermal medium between a cooling jacket mounted on a heat-generating portion and a heat-radiating portion to thereby cool the heat-generating portion, in which the circulation of the cooling liquid is continued until the temperature of the heat-generating portion becomes not higher than a predetermined value even after the information processing apparatus is stopped.

According to another aspect of the present invention, in an information processing apparatus having an information processing portion and an information display portion which are integrated with each other, there is provided a cooling method for cooling a heat-generating portion of the information processing apparatus by circulating a thermal medium between a cooling jacket mounted on a heat-generating portion and a heat-radiating portion to thereby cool the heat-generating portion, in which the length of at least one of an applied period of operating electric power and a stop period of the operating electric power is controlled under a predetermined voltage or under a predetermined frequency to thereby control the flow rate when a pump for circulating the cooling medium has such a characteristic that the flow rate increases in proportion to the voltage or frequency of operating electric power given from the outside.

BRIEF DESCRIPTION OF THE DRAWINGS

FIG. 4 shows an example of the control content shown in FIG. 3;

FIG. 6 shows an example of the control content shown in FIG. 5;

DETAILED DESCRIPTION OF THE EMBODIMENTS

Figure 1:
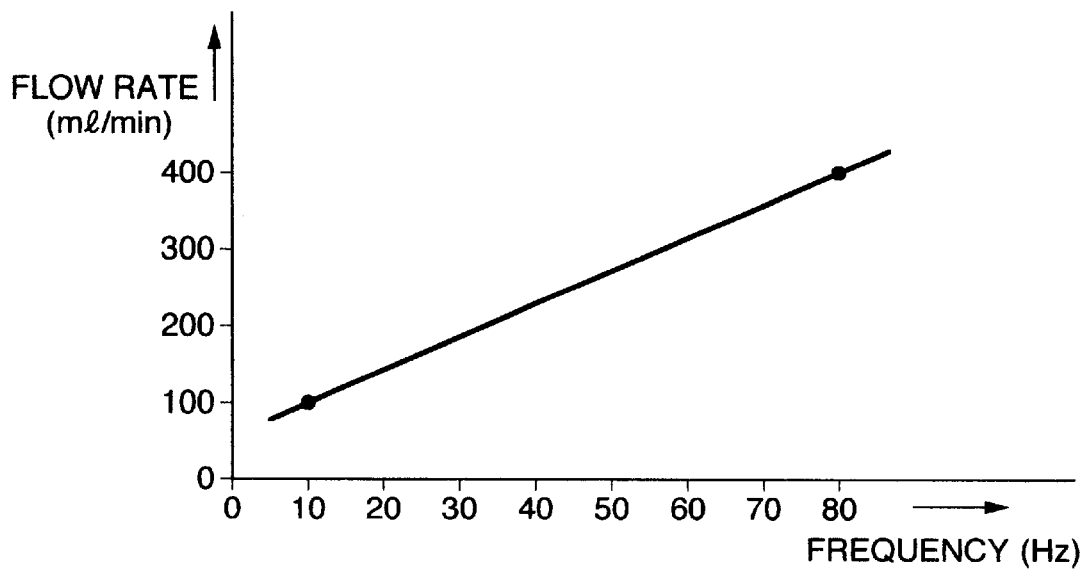
FIG. 1 shows the frequency characteristic of the flow rate of a pump used in an embodiment of the present invention.
Figure 2:
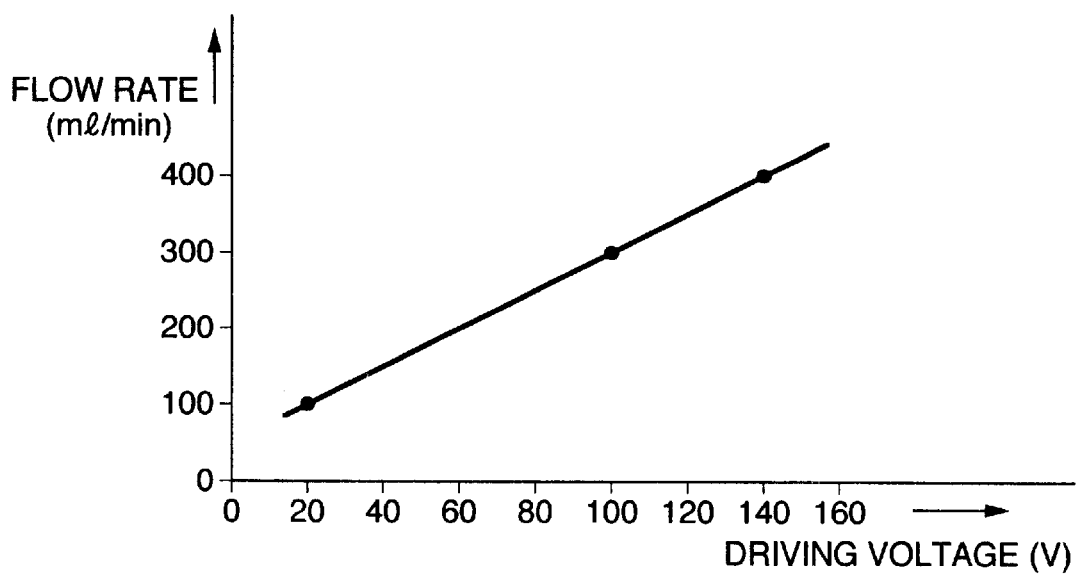
FIG. 2 shows the voltage characteristic of the flow rate of a pump used in an embodiment of the present invention.
Figure 3:
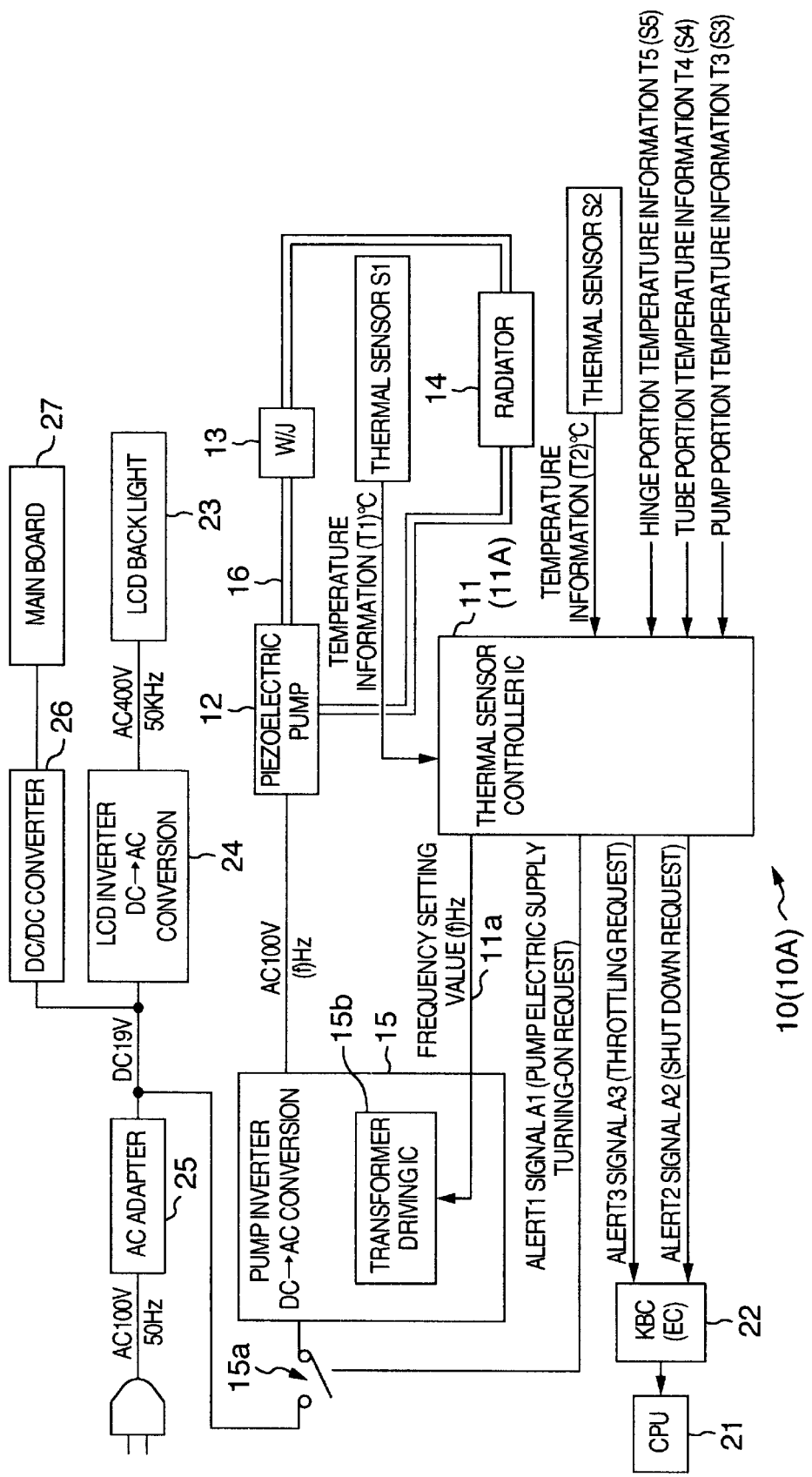
FIG. 3 shows the configuration of an embodiment using the pump having the characteristic shown in FIG. 1.
Figure 5:
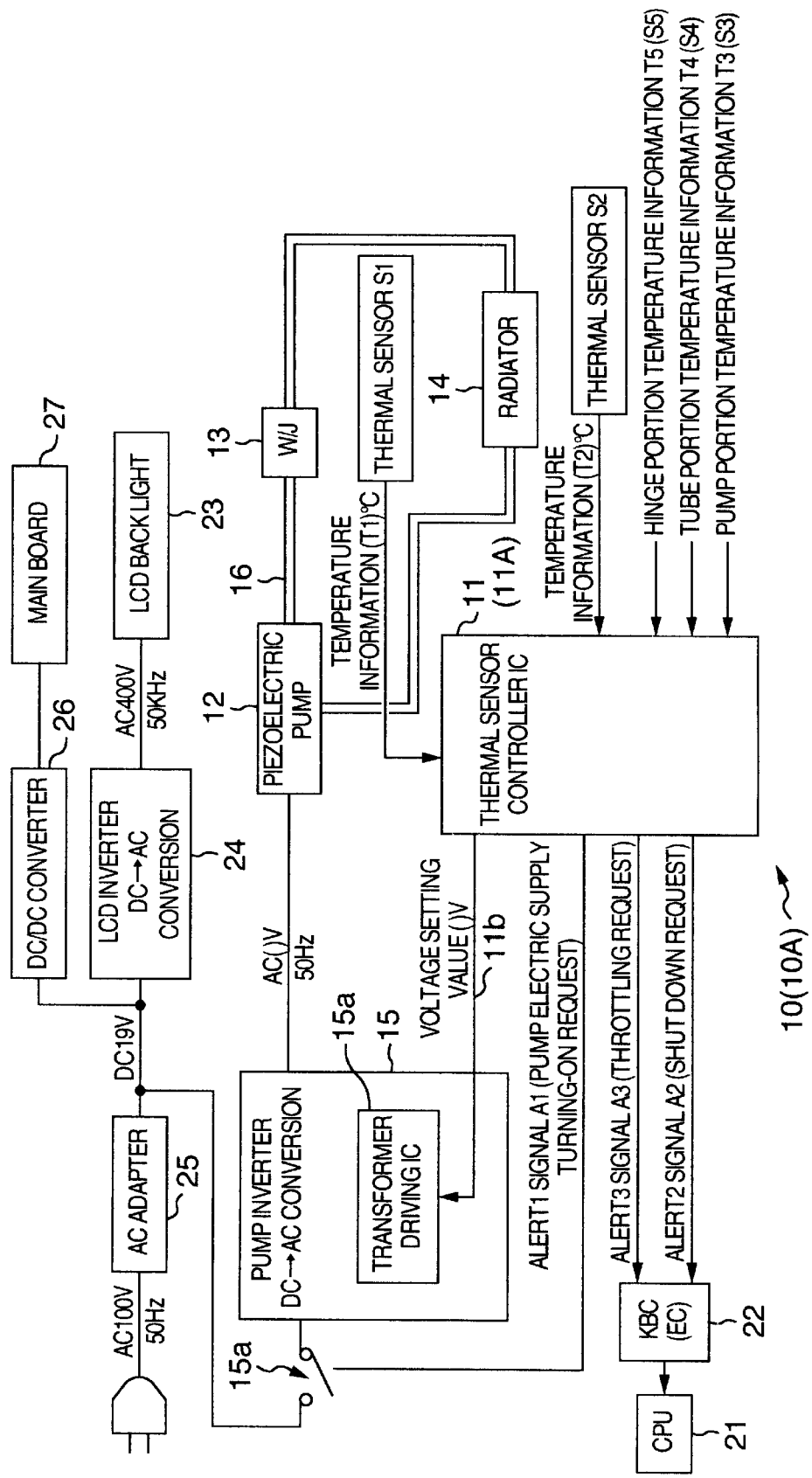
FIG. 5 shows the configuration of an embodiment using the pump having the characteristic shown in FIG. 2.
Figure 7:
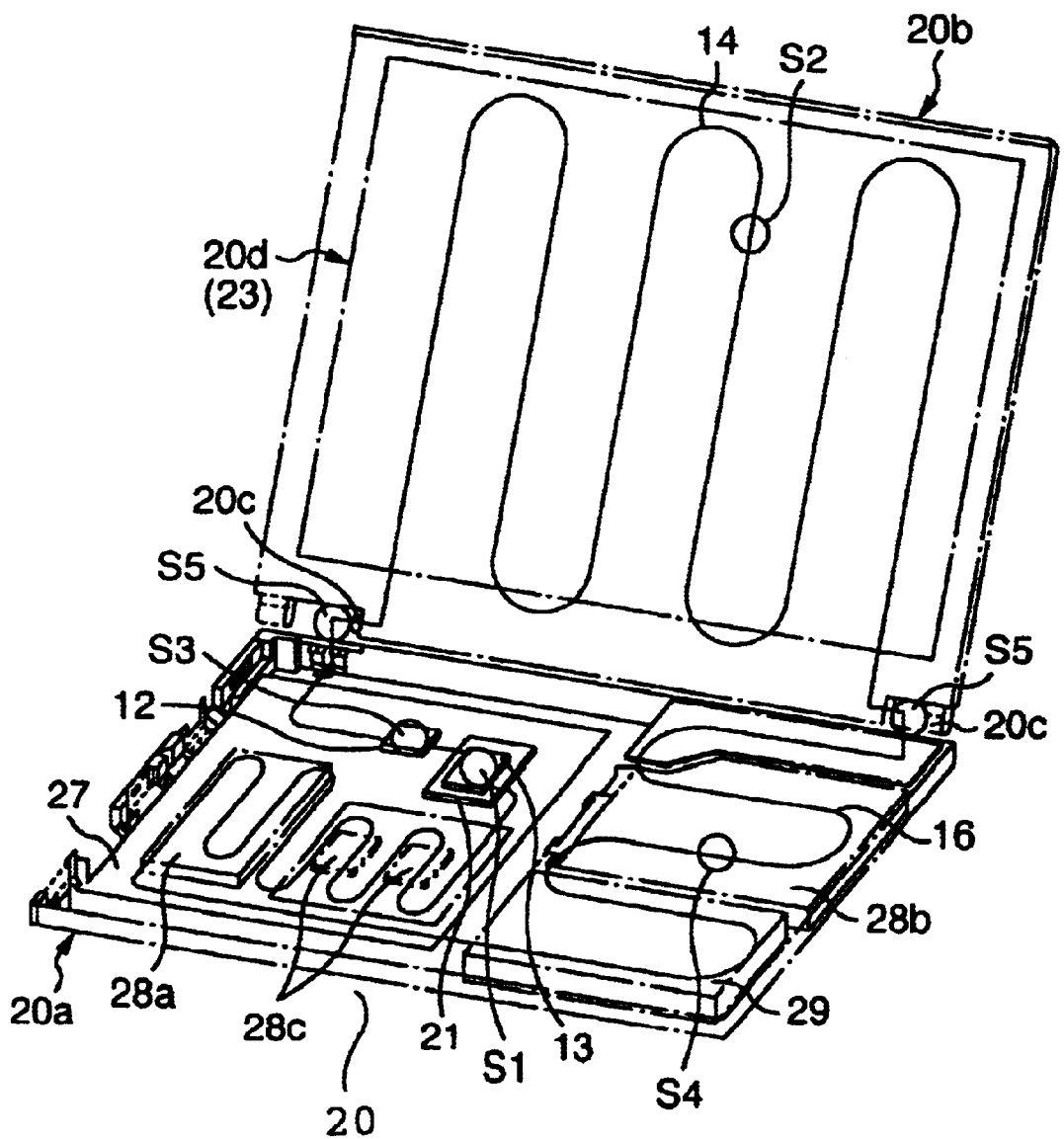
FIG. 7 is a perspective view showing an example of the internal structure of an information processing apparatus.
Figure 8:
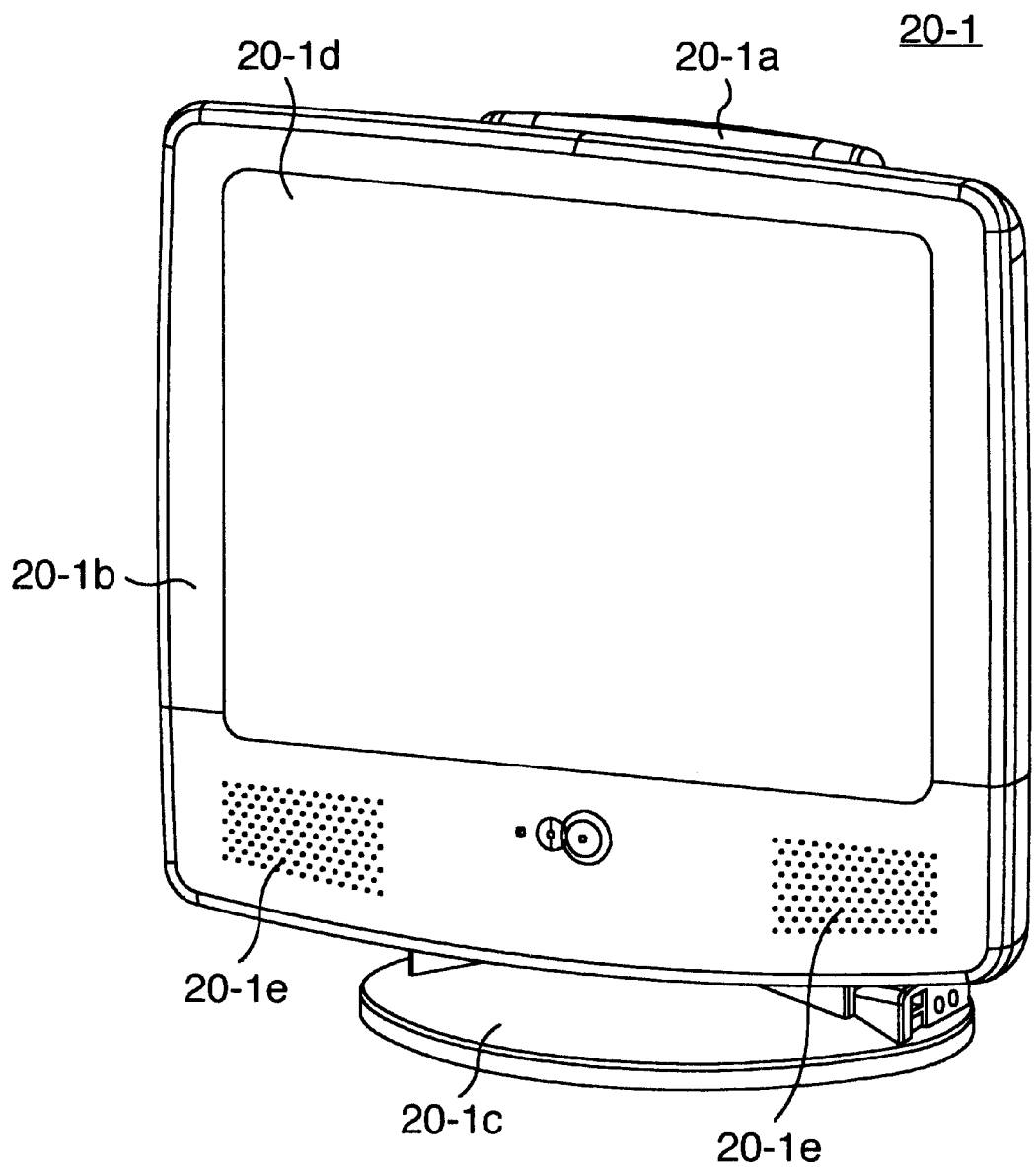
FIG. 8 shows an example of the external appearance of the information processing apparatus.
Figure 9:
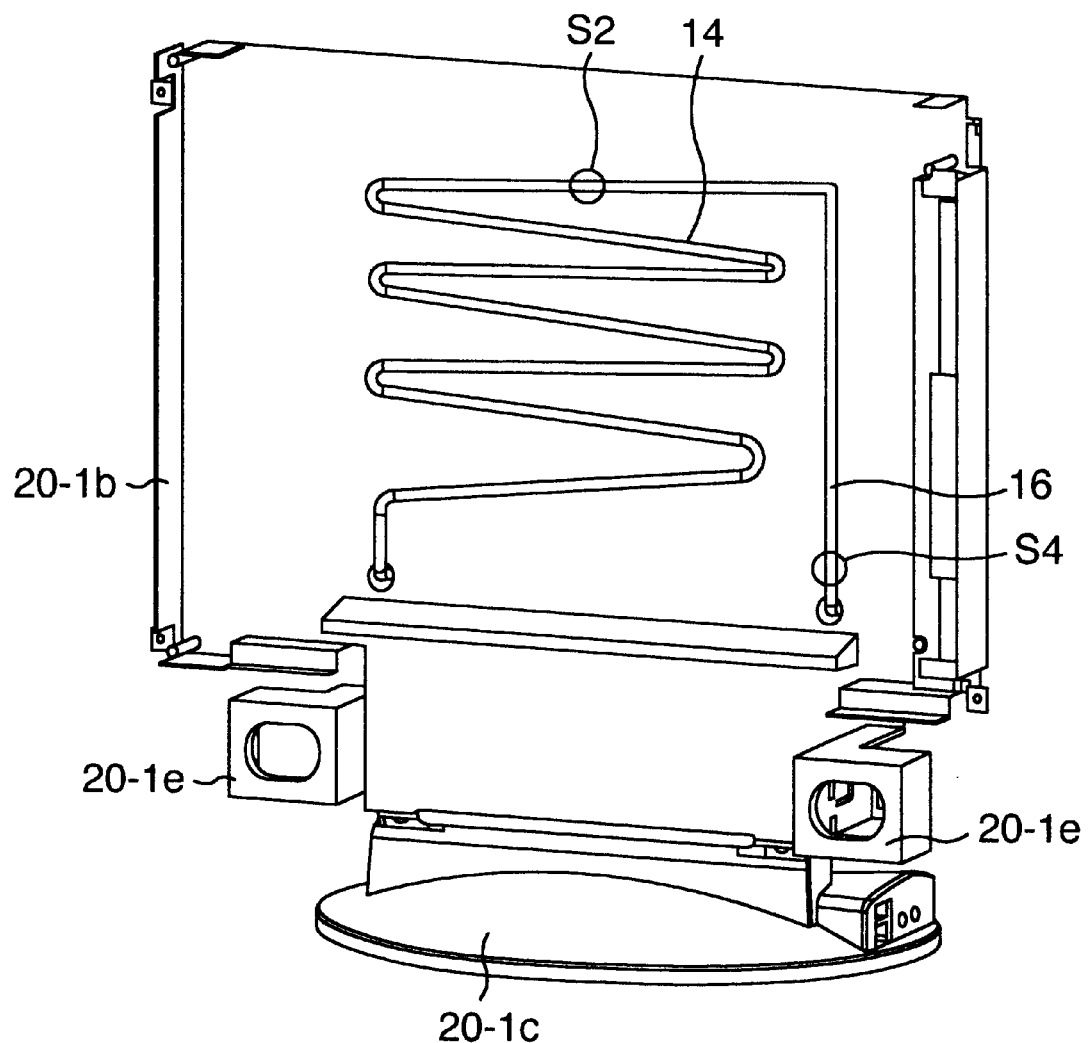
FIG. 9 shows the internal structure of the information processing apparatus shown in FIG. 8.
Figure 10:
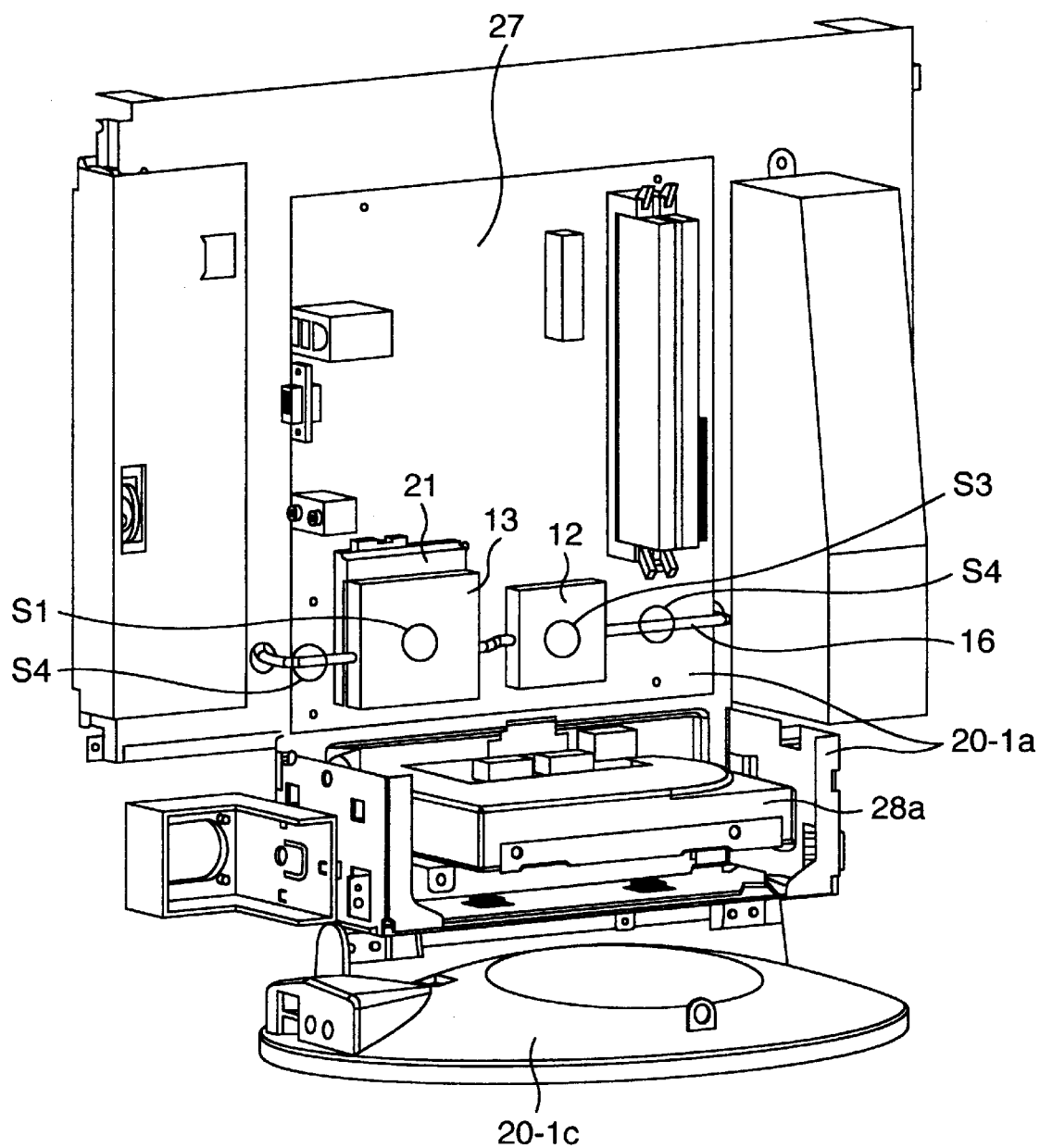
FIG. 10 is a rear view of the internal structure of the information processing apparatus of FIG. 8.
Figure 11A:
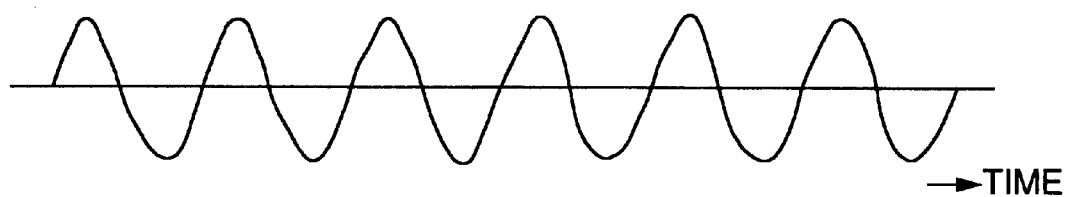
FIGS. 11A, 11B and 11C show examples of electric power supplied to the pump.
Figure 11B:
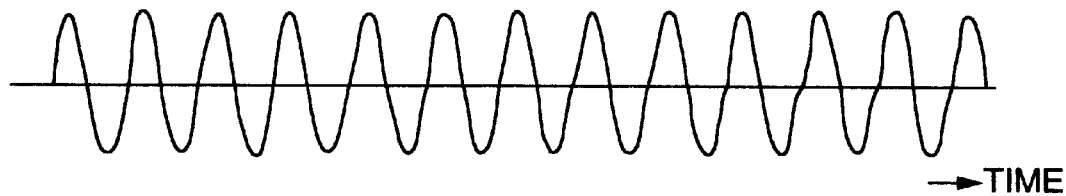
Figure 11C:
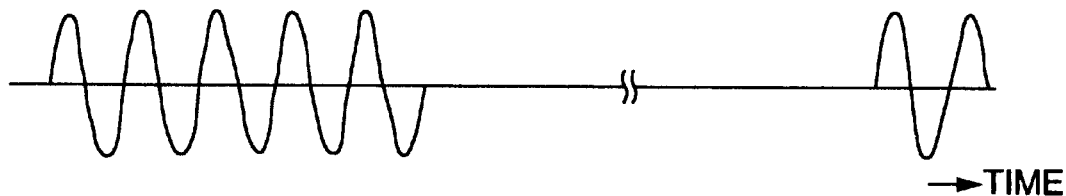
Figure 12A:
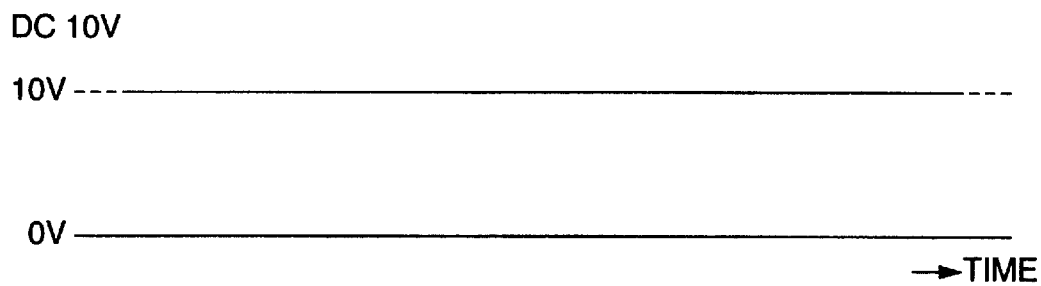
FIGS. 12A, 12B and 12C show other examples of electric power supplied to the pump.
Figure 12B:
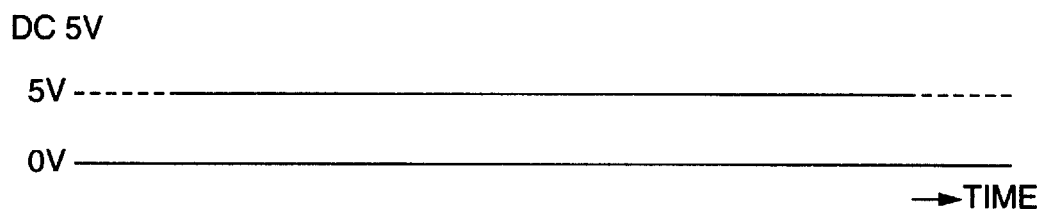
Figure 12C:
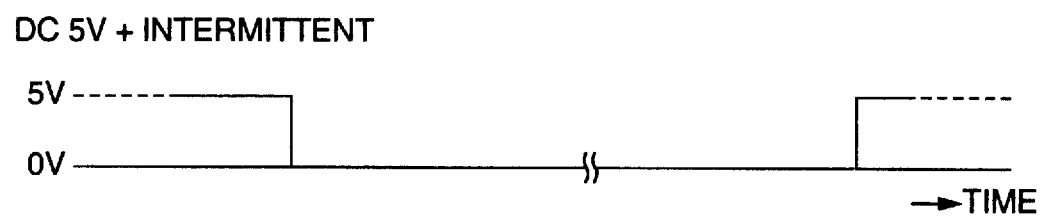

FIGS. 1 and 2 are graphs showing the frequency characteristic and the voltage characteristic, respectively, of the flow rate of a pump used in an embodiment of the present invention. FIGS. 3 and 5 are conceptual views showing an example of the configuration of the cooling system in the information processing apparatus according to this embodiment. FIGS. 4 and 6 are parameter tables showing examples of the control content of FIGS. 3 and 5, respectively. FIG. 7 is a perspective view showing an example of the internal structure of the information processing apparatus according to this embodiment. FIG. 8 is a perspective view showing an example of the external appearance of another information processing apparatus according to this embodiment. FIGS. 9 and 10 are perspective views showing an example of the internal structure of the another information processing apparatus.

As shown in FIG. 3, a cooling system 10 according to this embodiment comprises: a control portion 11 such as a thermal sensor control IC for totally controlling the cooling system 10; a cooling jacket 13 mounted on a CPU 21 such as a microprocessor constituting an information processing apparatus 20 which will be described later; a radiator 14 for radiating heat; a pump 12 for forcedly circulating a thermal medium M between the cooling jacket 13 and the radiator 14 through a tube 16; a pump driving portion 15 for driving the pump 12; a thermal sensor Si for detecting the temperature of the cooling jacket 13 and supplying the detected temperature as temperature information T1 to the control portion 11; and a thermal sensor S2 for detecting the temperature of the radiator 14 and supplying the detected temperature as temperature information T2 to the control portion 11.

The pump driving portion 15 is supplied with operating electric power through a switch 15a by an AC adapter 25 supplying electric power to an LCD inverter 24 and further to a DC/DC converter 26, etc. The LCD inverter 24 drives an LCD back light 23 constituting an information processing apparatus 20 which will be described later. The DC/DC converter 26 serves as a DC power supply for a main board 27.

A thermal sensor S3 is mounted on the pump 12 so that the temperature of the pump 12 is supplied to the control portion 11 as temperature information T3. A thermal sensor S4 is mounted on the tube 16, so that the temperature of the tube 16 is supplied to the thermal sensor S4 as temperature information T4. The thermal sensor S5 is supplied, as temperature information T5, with temperature of the tube 16 which passes a hinge of a notebook type information processing apparatus 20. The sensors S3, S4, S5, etc., may be connected to the control portion 11 as occasion demands. The hinge of the notebook type information processing apparatus 20 will be described later.

In response to at least one of the temperature information T1, T2, T3, T4 and T5, the control portion 11 has a control function for controlling the operation of the pump 12 by delivering the quantity of control to the pump driving portion 15 through a control interface 11a or by turning on/off the switch 15a through an ALART1 signal A1.

The pump 12 configured as shown in FIG. 3 has characteristic in which the flow rate of the thermal medium M increases in proportion to the increase of the frequency which is set in the pump driving portion 15 by the control portion 11 side as shown in the graph of FIG. 1.

FIG. 4 shows an example of setting of various kinds of parameters used in the controlling operation of the control portion 11 in accordance with measured results of the temperature information T1 and T2.

In the example of configuration shown in FIG. 3, there is shown the case where the control portion 11 uses the length control of the driving frequency and ON/OFF interval of the pump 12 as a control interface 11a given to the pump driving portion 15 in order to control the pump 12. That is, the pump driving portion 15 supplies the pump 12 with operating electric power with a variable frequency and other operating electric power with a constant frequency but a variable ON/OFF interval which is set in a transformer driving IC 15b included in the pump driving portion 15 from the control portion 11 side to thereby control the ON/OFF and flow rate of the pump 12.

FIGS. 5 and 6 show a modified example in the case where the control portion 11 uses the length control of the driving frequency and ON/OFF interval of the pump 12 as a control interface 11b given to the pump driving portion 15 in order to control the pump 12. That is, the pump driving portion 15 supplies the pump 12 with operating electric power with a variable frequency and other operating electric power with a variable ON/OFF interval which is set in the transformer driving IC 15b included in the pump driving portion 15 from the control portion 11 side to thereby control the flow rate of the pump 12.

The pump 12 configured as shown in FIG. 5 has characteristic in which the flow rate of the thermal medium M increases in proportion to the increase of the voltage which is set in the pump driving portion 15 from the control portion 11 side as shown in the graph of FIG. 2.

Although the examples of parameter setting in FIGS. 4 and 6 show temperature values in the case where water with a freezing temperature of 0° C. is used as the thermal medium M, it is a matter of course that various changes may be made in accordance with the freezing temperature of the thermal medium M.

The control portion 11 can perform the status control of the information processing apparatus 20 such as shutdown processing for stopping the operation of the information processing apparatus 20 totally by a normal procedure, CPU throttling for operating the CPU 21 with an operating frequency lower than the rating frequency, or the like, by sending out an ALART2 signal A2 and an ALART3 signal A3 to a keyboard controller 22 provided in the information processing apparatus 20.

That is, in the information processing apparatus 20 such as a personal computer, shutdown processing and CPU throttling can be executed by a specific keyboard operation. The control portion 11 achieves the shutdown processing and CPU throttling by generating a state equivalent to the specific keyboard operation in the inside of the keyboard controller 22 on the basis of the ALART2 signal A2 and the ALART3 signal A3.

Further, the control portion 11 judges whether the keyboard controller 22 can be operated or not, to thereby judge whether the operation of the information processing apparatus 20 including the keyboard controller 22 stops as a whole or not.

These control functions of the control portion 11 can be achieved by a built-in microcomputer not shown, or the like.

An example of the configuration of the information processing apparatus 20 according to this embodiment will be described below with reference to FIG. 7. The information processing apparatus 20 illustrated in FIG. 7 is constituted by a so-called notebook type space-saving personal computer comprising a body unit 20a and a display unit 20b which are integrated with and connected to each other foldably through a hinge portion 20c.

The body unit 20a includes a CPU 21, a peripheral chip 27 such as a bus controller, an external storage device 28a such as a magnetic disk device, an external storage device 28b for driving a commutative recording medium such as a CD-ROM, and a body driving battery 29 and further includes a keyboard controller 22, a real-time clock, and an LCD inverter 24 which are not shown in FIG. 7.

The display unit 20b includes a liquid-crystal panel 20d, and an LCD back light 23 which is not shown in FIG. 7 but disposed on the back of the liquid-crystal panel 20d.

In this embodiment, the cooling jacket 13 of the cooling system 10 is mounted so as to come into contact with the CPU 21 of the body unit 20a. The pump 12 is mounted so as to be close the CPU. The radiator 14 is disposed on the back side of the liquid-crystal panel 20d of the display unit 20b. The tube 16 is drawn around through the hinge portion 20c so as to connect the cooling jacket 13, the pump 12 and the radiator 14 to one another. In the example of FIG. 7, the tube 16 is drawn around so as to pass over the peripheral chip 27, the external storage devices 28a and 28b and the body driving battery 29.

The thermal sensor S1 is disposed on the cooling jacket 13. The thermal sensor S2 is disposed on the radiator 14.

As occasion demands, the thermal sensor S3 may be disposed in contact with the pump 12, the thermal sensor S5 may be disposed in a portion of the hinge portion 20c through which the tube 16 passes, and the thermal sensor S4 may be disposed on a part of the drawing path of the tube 16 (in the example of FIG. 7, the thermal sensor S4 is disposed on the upper portion of the external storage device 28b).

The configuration of a different type space-saving information processing apparatus 20-1 according to this embodiment will be described below with reference to FIGS. 8 to 10.

The information processing apparatus 20-1 comprises a body unit 20-1a, a display unit 20-1b, and a swivel base 20-1c. The body unit 20-1a is integrally connected to the back side of the display unit 20-1b and supported on the swivel base 20-1c so as to freely swivel and tilt back and forth.

As illustrated in FIG. 10, the body unit 20-1a includes a CPU 21, and an external storage device 28a such as a magnetic disk device, and further includes a keyboard controller 22, a real-time clock and an LCD inverter 24 which are not shown in FIG. 10.

The display unit 20-1b includes a liquid-crystal panel 20-1d, a not-shown LCD back light 23 disposed on the back of the liquid-crystal panel 20-1d, and speakers 20-1e on opposite sides of the lower portion of the display unit 20-1b.

In the information processing apparatus 20-1, the cooling jacket 13 of the cooling system 10 is mounted so as to come into contact with the CPU 21 of the body unit 20-1a. The pump is mounted so as to be close to the cooling jacket 13. The radiator 14 is disposed on the back side of the liquid-crystal panel 20-1d of the display unit 20-1b. The tube 16 is drawn around while piercing a frame portion, or the like, for supporting the liquid-crystal panel 20-1d. Accordingly, the tube 16 connects the cooling jacket 13 and the pump 12 on the body unit 20-1a side and the radiator 14 on the liquid-crystal panel 20-1d side to one another.

The thermal sensor S1 is disposed on the cooling jacket 13. The thermal sensor S2 is disposed on the radiator 14.

As occasion demands, the thermal sensor S3 may be disposed so as to come into contact with the pump 12, and the thermal sensor S4 may be disposed on a part of the drawing path of the tube 16 (in the example of FIG. 10, the thermal sensors S4 are disposed near the cooling jacket 13 and near the pump 12 respectively).

An example of the operation of this embodiment will be described below with reference to the graphs of FIG. 1 and FIGS. 11A to 11C.

The control portion 11 monitors the temperature of the heat-radiating portion of the CPU 21, or the like, on the basis of the temperature information T1 of the thermal sensor S1 in the condition that the ALART signal A1 is switched on to activate the pump driving portion 15. As shown in FIGS. 1 and 4, the control portion 11 sets the operating frequency of the pump 12 in accordance with the value of the temperature information T1 to control the flow rate of the thermal medium M circulated by the pump 12 so as to retain the cooling capacity to thereby prevent the heat-radiating portion of the CPU 21, or the like, from being overheated.

When overheating of the CPU 21 (in FIG. 4, the temperature of the thermal medium M is 110° C.) is detected because of a certain cause, the control portion 11 supplies the ALART signal A3 to the keyboard controller 22 to shift the operation of the CPU 21 into a CPU throttling state for operating the CPU 21 at a low speed (low heat value) with a frequency lower than the rating operating frequency at the time of ordinary running of the CPU 21. When overheating of the CPU 21 at a higher temperature (in FIG. 4, the temperature of the thermal medium M is 120° C.) is further detected, the control portion 11 supplies the ALART2 signal A2 to the keyboard controller 22 to perform the shutdown process for stopping the operation of the CPU 21.

As shown in FIG. 2 and FIGS. 12A to 12C, flow rate control owing to the setting control of the voltage applied to the pump 12 on the basis of the control interface 11b may be also performed as another flow rate control than the flow rate control owing to the setting control of the frequency applied to the pump 12 on the basis of the control interface 11a from the control portion 11 to the pump driving portion 15.

In either the flow rate control based on the frequency or the flow rate control based on the voltage, the configuration and control of the transformer driving IC constituting the pump driving portion 15 become relatively complex.

Therefore, in this embodiment, flow rate control may be made on the basis of the intermittent operating control of the pump 12 owing to the ON/OFF of the ALART1 signal A1 in the condition that the frequency or voltage is kept constant. In this case, for example, in the condition that the frequency or voltage is set to be the largest in an allowable range in advance, the ON/OFF interval of the ALART1 signal A1 may be controlled so that the flow rate can be controlled to take an optional value in a range of from the maximum flow rate based on continuous ON to the minimum flow rate (stop) based on continuous OFF.

In this case, the transformer driving IC constituting the pump driving portion 15 can be formed as a simple structure for outputting a constant frequency or voltage. Hence, the configuration and control of a system inclusive of the pump driving portion 15 for controlling the circulation of the thermal medium M can be simplified greatly.

Figure 13:
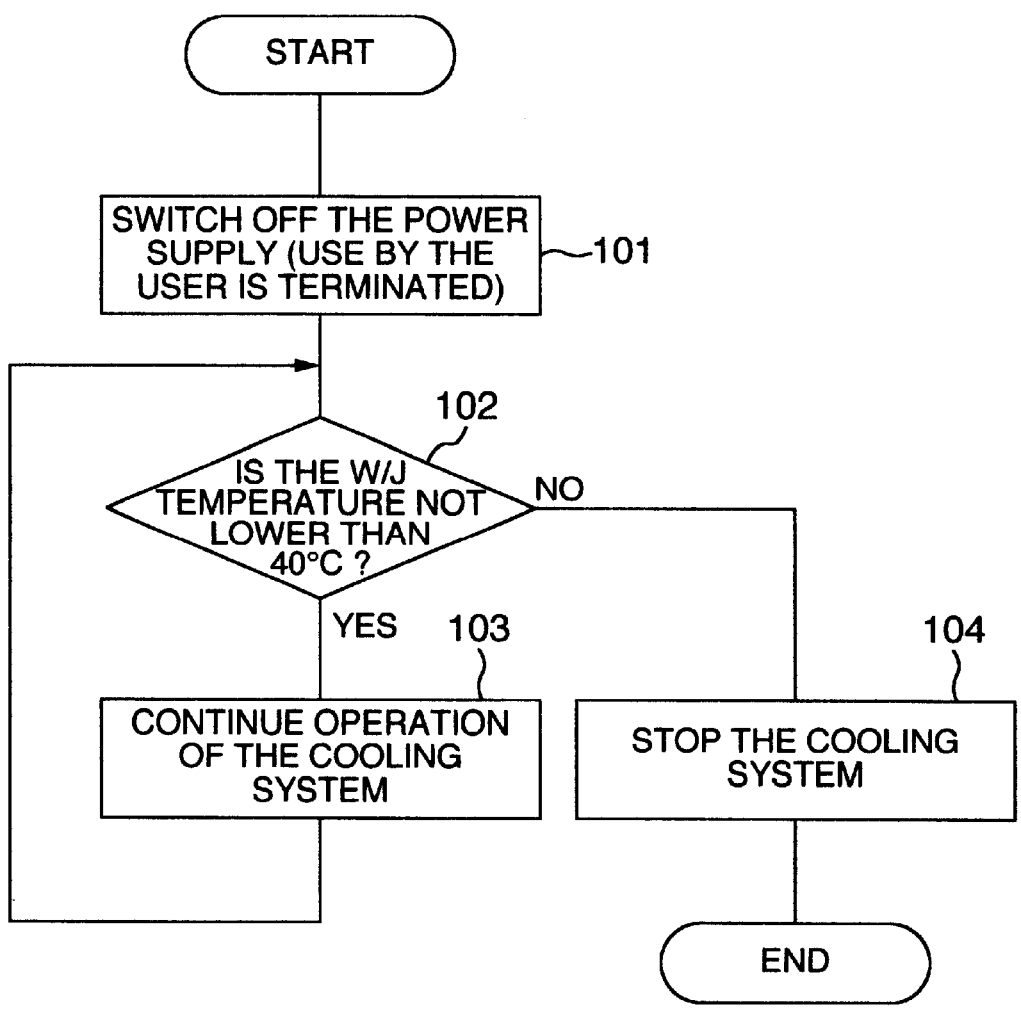
FIG. 13 is a flow chart showing the operation of an embodiment of the present invention.

FIG. 13 is a flow chart showing an example of the operation of another embodiment of the present invention.

This embodiment will be described in connection with prevention of overheating of the CPU 21 from being caused by residual heat, or the like, after the information processing apparatus 20 stops.

First, when switching off the electric supply for the information processing apparatus 20 is detected (step 101), the control portion 11 monitors the temperature of the cooling jacket 13, that is, the temperature of the heat-radiating portion of the CPU 21, or the like, on the basis of the temperature information T1 of the thermal sensor S1. While the temperature information T1 is not lower than a predetermined value (in FIG. 13, 40° C.) (step 102), the control portion 11 operates the pump 12 continuously (step 103). Thus, cooling the CPU 21 is continued. When the temperature of the CPU 21 is cooled to be not higher than a predetermined value, the control portion 11 stops the operation of the cooling system 10 inclusive of the pump 12 (step 104).

As described above, in this embodiment, cooling is continued until the temperature of the CPU 21 becomes not higher than a predetermined value even after the information processing apparatus 20 stops. Hence, overheating failure of the CPU 21 can be prevented from being caused by residual heat, or the like.

What is claimed is:

1. A cooling control method of an information processing apparatus by circulating a cooling liquid to thereby cool a heat-generating portion including at least a CPU, comprising the steps of:

measuring the temperature of said cooling liquid represented by a circulation path;

calculating an applied period and a stop period of supply electric power periodically applied to a cooling-liquid-circulating pump in accordance with the measured temperature of said cooling liquid;

controlling the flow rate of the circulated cooling liquid by operating said pump on the basis of said applied period and said stop period;

detecting whether the operation of said CPU stops or not; and continuing the circulation of said cooling liquid until setting of the temperature of said heat-generating portion becomes not higher than a predetermined value even after stoppage of the operation of said CPU.

* * * * *